US007928581B2

(12) United States Patent
Tanida et al.

(10) Patent No.: US 7,928,581 B2

(45) Date of Patent: Apr. 19, 2011

(54) SEMICONDUCTOR DEVICE HAVING A CONDUCTIVE MEMBER INCLUDING AN END FACE SUBSTANTIALLY FUSH WITH AN END FACE OF A WIRING BOARD AND METHOD OF MANUFACTURING THE SAME

(75) Inventors: Kazumasa Tanida, Chiba (JP); Osamu Miyata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 538 days.

(21) Appl. No.: 11/630,162

(22) PCT Filed: Oct. 17, 2005

(86) PCT No.: PCT/JP2005/019003

§ 371 (c)(1),
(2), (4) Date: Dec. 20, 2006

(87) PCT Pub. No.: WO2006/057117

PCT Pub. Date: Jun. 1, 2006

(65) Prior Publication Data

US 2008/0036043 A1 Feb. 14, 2008

(30) Foreign Application Priority Data

Nov. 25, 2004 (JP) ................................ 2004-341028

(51) Int. Cl.
*H01L 23/48* (2006.01)
*H01L 23/52* (2006.01)
*H01L 29/40* (2006.01)

(52) U.S. Cl. ......... 257/777; 257/778; 257/686; 257/622

(58) Field of Classification Search .................. 257/777, 257/778, 774, 723, 784, 786, 787, 789, 788, 257/779, 780, 781, 782, 783, 686, 730
See application file for complete search history.

(56) References Cited

U.S. PATENT DOCUMENTS 5,729,437 A 3/1998 Hashimoto
5,959,846 A * 9/1999 Noguchi et al. .............. 361/782
6,329,228 B1 * 12/2001 Terashima .................... 438/156
6,943,100 B2 * 9/2005 Chinda et al. ................ 438/612
2002/0020896 A1 2/2002 Ishikawa et al.
2002/0053742 A1 * 5/2002 Hata et al. ..................... 257/774
2003/0067084 A1 * 4/2003 Shintani ........................ 257/778
2003/0183944 A1 * 10/2003 Taniguchi ..................... 257/777
2005/0104186 A1 * 5/2005 Yang et al. .................... 257/688
2005/0263873 A1 * 12/2005 Shoji ............................ 257/698

FOREIGN PATENT DOCUMENTS

JP 8-107161 4/1996

(Continued)

*Primary Examiner* — Thao X Le
*Assistant Examiner* — Thanh Y Tran
(74) *Attorney, Agent, or Firm* — Rabin & Berdo, PC

(57) ABSTRACT

A manufacture method for semiconductor device (1, 21) including: a sealing-resin-layer forming step of forming a sealing resin layer (7) on a conductive member (13) formed at lest on one surface of a base substrate (11) formed with a plurality of wiring boards (2) therein, the conductive member spanning a boundary between a respective pair of adjoining wiring boards; and a step of moving the base substrate and a cutting tool (B) relative to each other in a manner to allow the cutting tool to pass through the base substrate from the other surface (**2*b***) opposite from the one surface thereof toward the one surface thereof, thereby cutting the base substrate along the boundary between the respective pair of adjoining wiring boards.

70 Claims, 6 Drawing Sheets

1 3 4 3a 6 6W 6 2e 6T 5 2a 7 2 2b 5 2e 6 6T 6W 7 2 8 6e 2e 7e

FOREIGN PATENT DOCUMENTS

| | | |
|---|---|---|
| JP | 08-274209 | 10/1996 |
| JP | 2001-068799 | 3/2001 |
| JP | 2002-050714 | 2/2002 |
| JP | 2002-223001 | 8/2002 |

* cited by examiner 5
4
2
3
7P
5
12
13
2b
4
2
3
2a
11

5
11
3
7
2
3a
4
5
12
D
C
13
5
2b
2a
2
7
3
3a
4
5
14
15

SEMICONDUCTOR DEVICE HAVING A CONDUCTIVE MEMBER INCLUDING AN END FACE SUBSTANTIALLY FUSH WITH AN END FACE OF A WIRING BOARD AND METHOD OF MANUFACTURING THE SAME

TECHNICAL FIELD

The present invention relates to a semiconductor device comprising a wiring board and a semiconductor chip connected thereto, and a manufacture method therefor.

BACKGROUND ART

The semiconductor device includes one which comprises a wiring board, and a semiconductor chip connected thereto and directing its functional surface to one surface of the wiring board, the functional surface being formed with a functional element.

The wiring board is formed with a conductive film which extends from the one surface thereof connected with the semiconductor chip to the other surface thereof opposite from the one surface thereof via an end face of the wiring board. The conductive film includes: an external connection portion for connecting the semiconductor device to a mounting board, the external connection portion extending from the end face of the wiring board to the other surface thereof; and a wiring portion for interconnection between the semiconductor chip and the external connection portion, the wiring portion being formed on the one surface of the wiring board.

Such a semiconductor device is obtained by connecting individual semiconductor chips to individual wiring boards in a greater board (hereinafter, referred to as "base substrate") which is formed with the plurality of wiring boards therein and then, cutting the base substrate into the individual wiring boards. In this process, the base substrate is mechanically cut by means of a cutting tool such as a dicing blade.

The base substrate is formed with through holes, each of which spans a boundary between a pair of adjoining wiring boards and extends through the base substrate in a thickness direction thereof. The conductive film formed of a metal material is provided on an inside surface of the through-hole and on its peripheral areas on the one surface and the other surface. The wiring board provided with the conductive film including the external connection portion and the wiring portion is obtained by cutting the conductive film together with the base substrate.

Patent Document 1: Japanese Unexamined Patent Publication No. 2002-50714

DISCLOSURE OF THE INVENTION

Problem to be Solved by the Invention

However, the conductive film formed of the metal material is ductile. Therefore, when the conductive film is cut by the cutting tool, the conductive film is stretched as drawn in a moving direction of the cutting tool and sustains burring (an elongated portion) on its downstream side with respect to the moving direction. If such a semiconductor device sustaining burring is mounted on the mounting board, the burrs may cause the semiconductor device to be short-circuited by any other component or the like mounted on the mounting board in adjoining relation. Otherwise, if the burrs are separated from the semiconductor device and fall on the mounting board, the burrs may also produce a short circuit on the mounting board.

It is therefore an object of the invention to provide a semiconductor device free of the burrs at a conductive member and a manufacture method which ensures the manufacture of such a semiconductor.

Means for Solving the Problem

According to a first aspect of the invention, a manufacture method for semiconductor device comprises: a step of preparing a base substrate formed with a plurality of wiring boards therein and including a conductive member formed at lest on one surface thereof, the conductive member spanning a boundary between a respective pair of adjoining wiring boards; a chip connecting step of connecting a semiconductor chip, having a functional surface formed with a functional element, with each of the wiring boards in a manner that the functional surface opposes the one surface with a predetermined distance therebetween; a sealing-resin-layer forming step of forming a sealing resin layer in a gap between the base substrate and the semiconductor chip and on the conductive member, the sealing-resin-layer forming step being performed after the chip connecting step; and a step of moving the base substrate and a cutting tool relative to each other in a manner to allow the cutting tool to pass through the base substrate from the other surface opposite from the one surface thereof toward the one surface thereof, thereby cutting the base substrate along the boundary between the respective pair of adjoining wiring boards, the step of moving the base substrate and the cutting tool being performed after the sealing-resin-layer forming step.

According to the invention, the semiconductor device having a structure wherein the semiconductor chip is connected to the wiring board may be obtained by cutting the base substrate along the boundary between the respective pair of adjoining wiring boards. On the base substrate, each semiconductor device is connected with each wiring board.

In the step of cutting the base substrate, the cutting tool (such as a dicing blade or cutting die) is moved relative to the base substrate in a manner to pass through the base substrate from the other surface opposite from the one surface formed with the sealing resin layer toward the one surface. At this time, even though the conductive member is formed of the metal material having ductility, the sealing resin layer on the downstream side with respect to the moving direction of the cutting tool prevents the conductive member from being stretched as drawn by the cutting tool. Therefore, the manufacture method is adapted to manufacture the semiconductor device free of the burring (the elongated portion) at the conductive member. Since the semiconductor device is free of the burring at the conductive member, the semiconductor device involves no fear of being short-circuited with any other component mounted on the mounting board when the semiconductor device is mounted thereon.

The step of cutting the base substrate may also include: a step of affixing a tape to the one surface (connected with the semiconductor chip) of the base substrate; and a step of cutting the base substrate (with the tape affixed to the one surface thereof) along the boundary between the respective pair of adjoining wiring boards. In this case, the tape can be affixed to the one surface with a decreased height difference between the semiconductor chip and a region free of the semiconductor chip, with respect to the base substrate by virtue of the sealing resin layer formed on the conductive member, as compared with a case where the sealing resin layer is not formed on such a region.

The sealing resin layer may be formed on the one surface of the base substrate as covering a continuous region including in the gap defined by the semiconductor chip and on the conductive member. For instance, the sealing resin layer may be formed substantially on the overall area of the one surface.

A known underfill material may be used as a resin material forming the sealing resin layer. The sealing resin layer on the conductive member may be formed by spreading the underfill material to the vicinity of the boundary (the respective ends of the wiring boards) between the adjoining wiring boards each formed with the conductive member. Conventionally, the underfill material is provided only in the gap between the base substrate (wiring board) and the semiconductor chip and at the periphery of the gap. The sealing resin layer on the conductive member need not be formed separately from the underfill.

The base substrate may be formed with a through-hole at a region spanning the boundary between a respective pair of adjoining wiring boards, the through-hole extending through the base substrate in a thickness direction thereof. In this case, the conductive member may be continuously formed to extend from the one surface to the other surface via an inside surface of the through-hole.

In this case, the base substrate is cut along the boundary between the respective pair of adjoining wiring boards, whereby the through-hole is divided to define a groove formed at a respective end face of the wiring boards. On the other hand, the conductive member formed in the through-hole defines a conductive member formed on the end face (groove) of the wiring board.

According to this constitution, the step of cutting the base substrate ensures that a portion of the conductive member which is formed on the other surface is prevented from being drawn and stretched by the cutting tool because of the base substrate present on the downstream side with respect to the moving direction of the cutting tool. Accordingly, the manufacture method provides the semiconductor device which includes the conductive member extending from the one surface of the wiring board to the other surface thereof via the end face (groove) thereof and which is free of the burrs.

The semiconductor device thus manufactured has the external connection portion defined by the portions of the conductive member which are formed in the groove (the end face of the wiring board) and formed on the other surface of the wiring board, so that the semiconductor device may be connected with an electrode pad formed on the mounting board by, for example, soldering.

According to a second aspect of the invention, a semiconductor device comprises: a wiring board; a semiconductor chip having a functional surface formed with a functional element, and bonded to one surface of the wiring board as directing thereto the functional surface thereof and maintaining a predetermined distance with respect to the one surface of the wiring board; a conductive member formed at least on the one surface of the wiring board, and including an end face substantially flush with an end face of the wiring board; and a sealing resin layer formed in a gap between the wiring board and the semiconductor chip and on the conductive member.

The semiconductor device can be manufactured by the aforementioned manufacture method.

The end face of the wiring board may be formed with a groove extended along the overall thickness of the wiring board. In this case, the conductive member may be continuously formed to extend from the one surface to the other surface opposite from the one surface via an inside surface of the groove.

The semiconductor device may further comprise a lid member formed to close the groove at a side thereof adjacent to the one surface.

The semiconductor device can be manufactured using a base substrate wherein the lid member is formed on the one-surface side in a manner to close the through-hole. The sealing resin layer may be formed by applying an uncured (liquid) sealing resin to the one surface of the base substrate in a film form, followed by curing the sealing resin. In this case, the lid member prevents the uncured sealing resin from flowing into the through-hole. Because of this, a problem that the external connection portion is covered by the sealing resin layer, disabling connection for example by soldering can be obviated in a case where the conductive member formed on the inside surface of the through-hole is used as the external connection portion.

The lid member may have conductivity. In this case, the lid member may be connected with the conductive member. The lid member may be formed of a metal material. In this case, the lid member may be formed by plating.

These and other objects, advantages and features of the present invention will become apparent from the following description thereof taken in conjunction with the accompanying drawings.

BEST MODES FOR CARRYING OUT THE INVENTION

Figure 1:
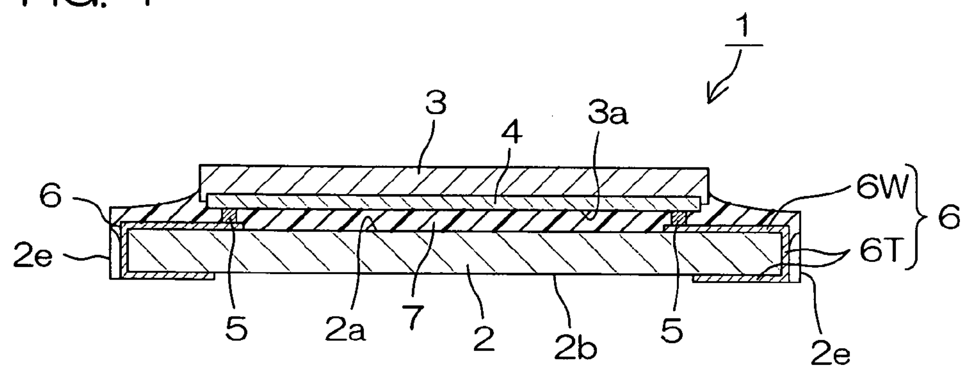
FIG. 1 is an illustrative sectional view showing a structure of a semiconductor device according to a first embodiment of the present invention.

FIG. 1 is an illustrative sectional view showing a structure of a semiconductor device according to a first embodiment of the present invention.

The semiconductor device 1 comprises: a wiring board 2; and a semiconductor chip 3 having a functional surface 3*a* formed with a functional element 4. The semiconductor chip 3 is connected to a front surface 2*a* of the wiring board 2 by means of a connecting member 5 in a manner to oppose the functional surface 3*a* thereof to the surface 2*a* of the wiring board 2 and to maintain a predetermined distance with respect to the front surface 2*a*.

In a neighborhood of an end face 2*e* of the wiring board 2, a conductive film 6 formed of a metal material such as copper (Cu) is provided. The conductive film 6 includes: an external connection portion 6T continuously formed to cover an area extending from the end face 2*e* to a surface (back surface) 2*b* opposite from the front surface 2*a*; and a wiring portion 6W formed on the front surface 2*a* for interconnection between the external connection portion 6T and the connecting member 5. The wiring portion 6W and the external connection portion 6T are formed in one (unitary) piece. The connecting member 5 is formed on the wiring portion 6W.

In a plan view vertically viewing down the front surface 2*a*, the wiring board 2 is larger than the semiconductor chip 3 so that a region not opposed by the semiconductor chip 3 exists at a circumferential area of the wiring board 2. A sealing resin layer 7 is overlaid substantially on the overall area of the front surface 2*a* of the wiring board 2. The sealing resin layer 7 is formed of a known underfill material. The sealing resin layer 7 is filled in the gap between the wiring board 2 and the semiconductor chip 3, thereby protecting the functional surface 3*a* of the semiconductor chip 3 and the connecting member 5. The sealing resin layer 7 overlies the wiring portion 6W of the conductive film 6.

The semiconductor device 1 can be connected to a mounting board via the external connection portion 6T or portions of the conductive film 6 which are formed on the end face 2*e* and the back surface 2*b* of the wiring board 2. In this process, the external connection portion 6T and an electrode pad formed on the mounting board may be connected by soldering.

Figure 2:
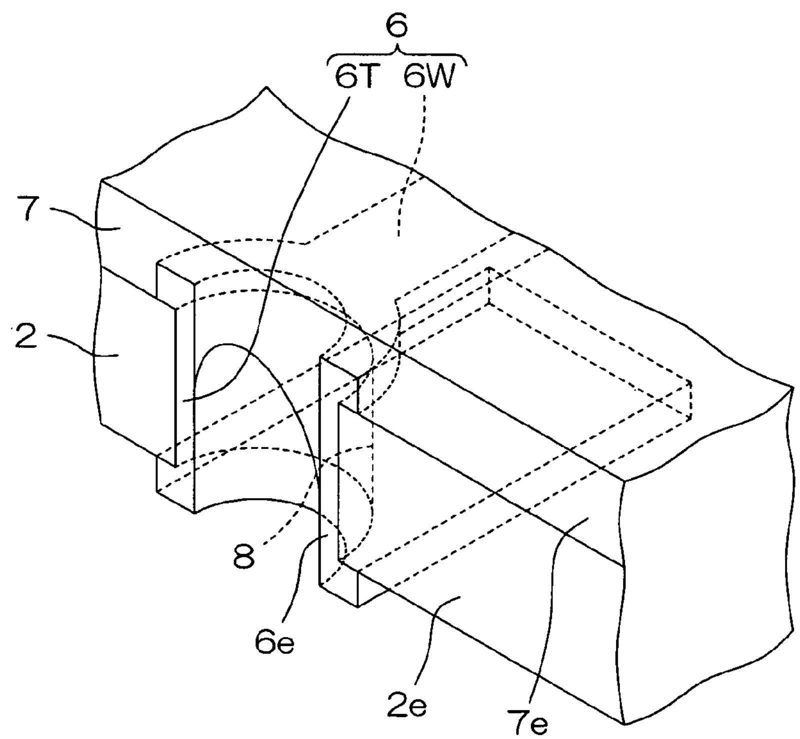
FIG. 2 is an illustrative perspective view showing in enlarged dimension a neighborhood of an end face of a wiring board of the semiconductor device shown in FIG. 1.

FIG. 2 is an illustrative perspective view showing in enlarged dimension the neighborhood of the end face 2*e* of the wiring board 2.

A half-column like groove 8 is formed in the end face 2*e* of the wiring board 2 as extending along the overall thickness of the wiring board 2.

In the groove 8, the external connection portion 6T is formed along an inside surface of the groove 8. On the back surface 2*b*, the external connection portion 6T is extended internally of the back surface 2*b*. At a connection with the external connection portion 6T, the wiring portion 6W is formed in a semicircular arc shape along a circumference of the groove 8.

An end face 7*e* of the sealing resin layer 7 (face on an end-face-2*e* side with respect to an in-plane direction of the wiring board 2) and an end face 6*e* of the external connection portion 6T (face on the end-face-2*e* side with respect to the in-plane direction of the wiring board 2) are substantially flush with the end face 2*e* of the wiring board 2.

Figure 3A:
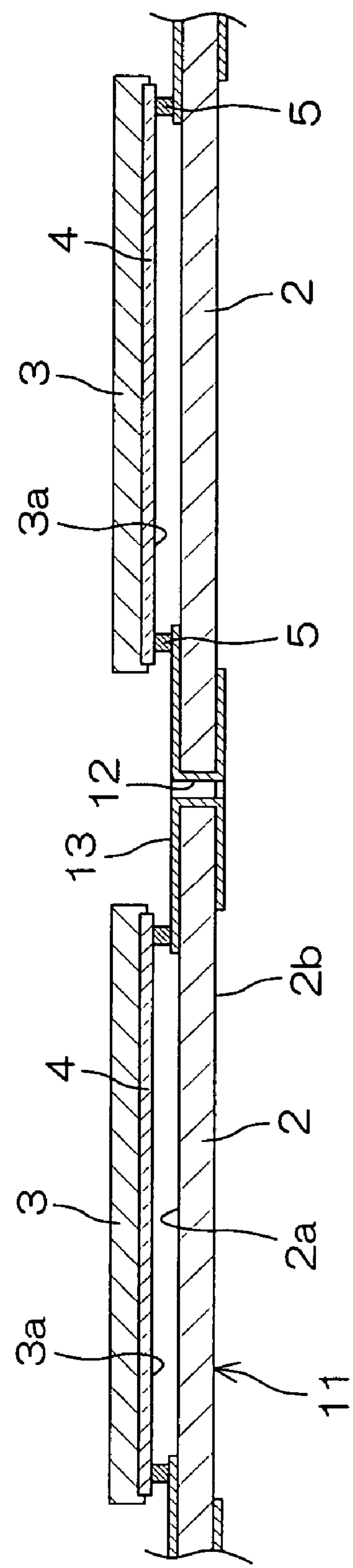
FIG. 3A is an illustrative sectional view for explaining a method for manufacturing the semiconductor device shown in FIG. 1.
Figure 3B:
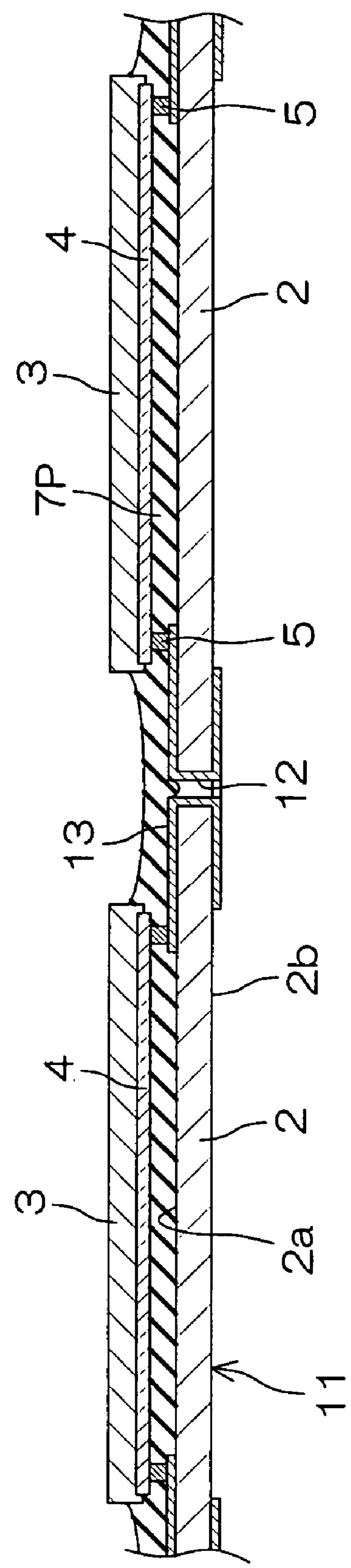
FIG. 3B is an illustrative sectional view for explaining the method for manufacturing the semiconductor device shown in FIG. 1.
Figure 3C:
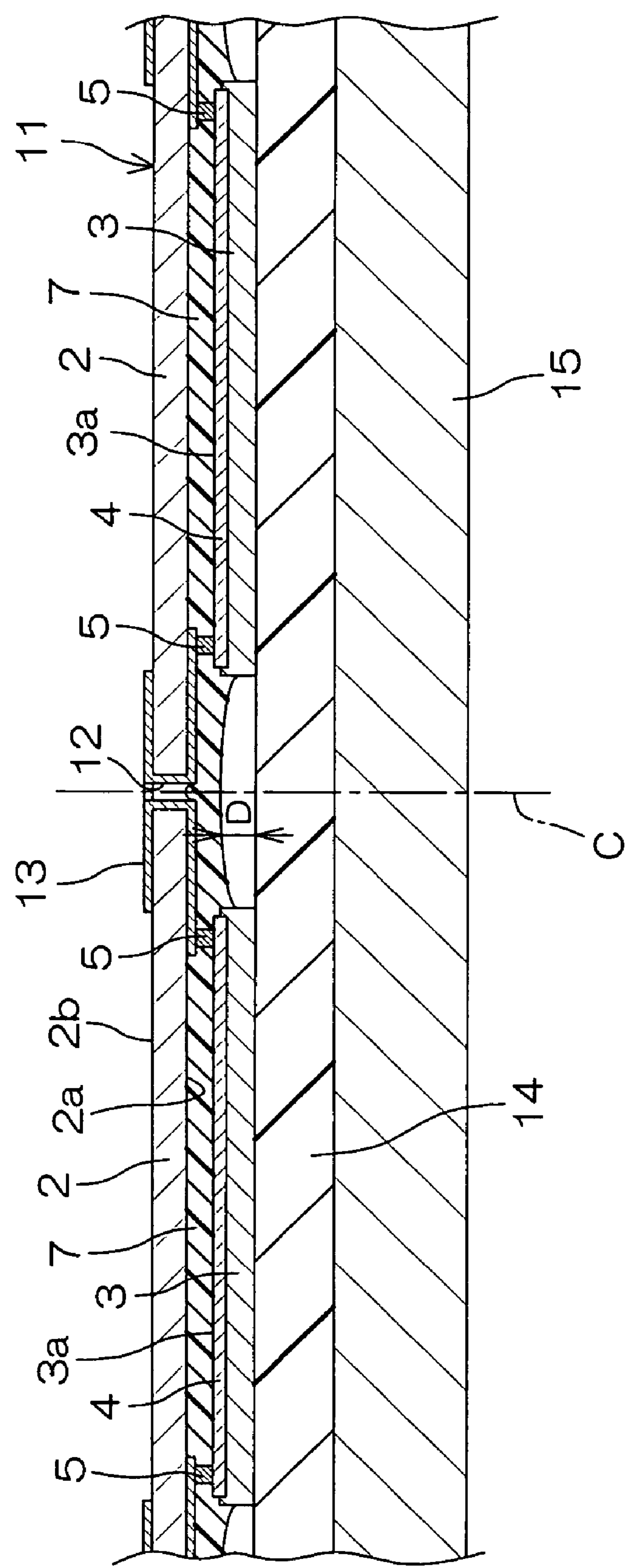
FIG. 3C is an illustrative sectional view for explaining the method for manufacturing the semiconductor device shown in FIG. 1.

FIG. 3A to FIG. 3C are illustrative sectional views for explaining a method for manufacturing the semiconductor device 1.

The semiconductor device 1 is obtained by connecting individual semiconductor chips 3 to individual wiring boards 2 in a greater board (hereinafter, referred to as "base substrate") 11 which is formed with the plurality of wiring boards 2 therein and then, dividing the base substrate 11 into the individual wiring boards 2.

In the base substrate 11, a through-hole 12 extending through the base substrate 11 in a thickness direction thereof is formed at a region spanning a boundary between a respective pair of adjoining wiring boards 2.

In the base substrate 11, a conductive film 13 is provided at a region corresponding to the conductive film 6 of the semiconductor device 1 (see FIG. 1 and FIG. 2), the conductive film 13 being formed of the same metal material as that of the conductive film 6. The conductive film 13 is formed at a region spanning the boundary between the respective pair of adjoining wiring boards 2 and covers an inside wall of the through-hole 12.

Such a base substrate 11 is placed as directing the front surface 2*a* upward. On the front surface 2*a*, each semiconductor chip 3 is connected with each of the wiring boards 2 as maintaining a predetermined distance with respect to the front surface 2*a* (see FIG. 3A). The semiconductor chip 3 is connected as opposing the functional surface 3*a* thereof to the front surface 2*a*. At this time, the connecting member 5 of the semiconductor chip 3 is connected with the conductive film 13 (at the portion corresponding to the wiring portion 6W).

Subsequently, a layer of an uncured (liquid) sealing resin 7P is overlaid on the overall area of the front surface 2*a* of the base substrate 11 in order to form the sealing resin layer 7 (see FIG. 3B). The layer of uncured sealing resin 7P fills the gap between the base substrate 11 and the semiconductor chip 3, while substantially completely covering a portion of the conductive film 13 which is formed on the front surface 2*a* or the portion corresponding to the wiring portion 6W. The uncured resin is cured to form the sealing resin layer 7.

Next, the front surface 2*a* of the base substrate 11 is affixed to a support plate 15 by means of a tape 14, whereby the base substrate 11 with its front surface 2*a* directed downward is supported by the support plate 15. This state is shown in FIG. 3C.

By virtue of the sealing resin layer 7 formed on the conductive film 13, a height difference D between the semiconductor chip 3 and a region free of the semiconductor chip 3, with respect to the base substrate 11, is decreased as compared with a case where the sealing resin layer 7 is not formed on such a region, when the tape 14 is affixed.

The base substrate 11 together with the tape 14 and the support plate 15 are cut along the boundary between the respective pair of adjoining wiring boards 2 (a cutting position C is indicated by a dot-dash line in FIG. 3C), so that the base substrate 11 is divided into the individual wiring substrates 2. Thus is obtained the semiconductor device 1 shown in FIG. 1.

Figure 4:
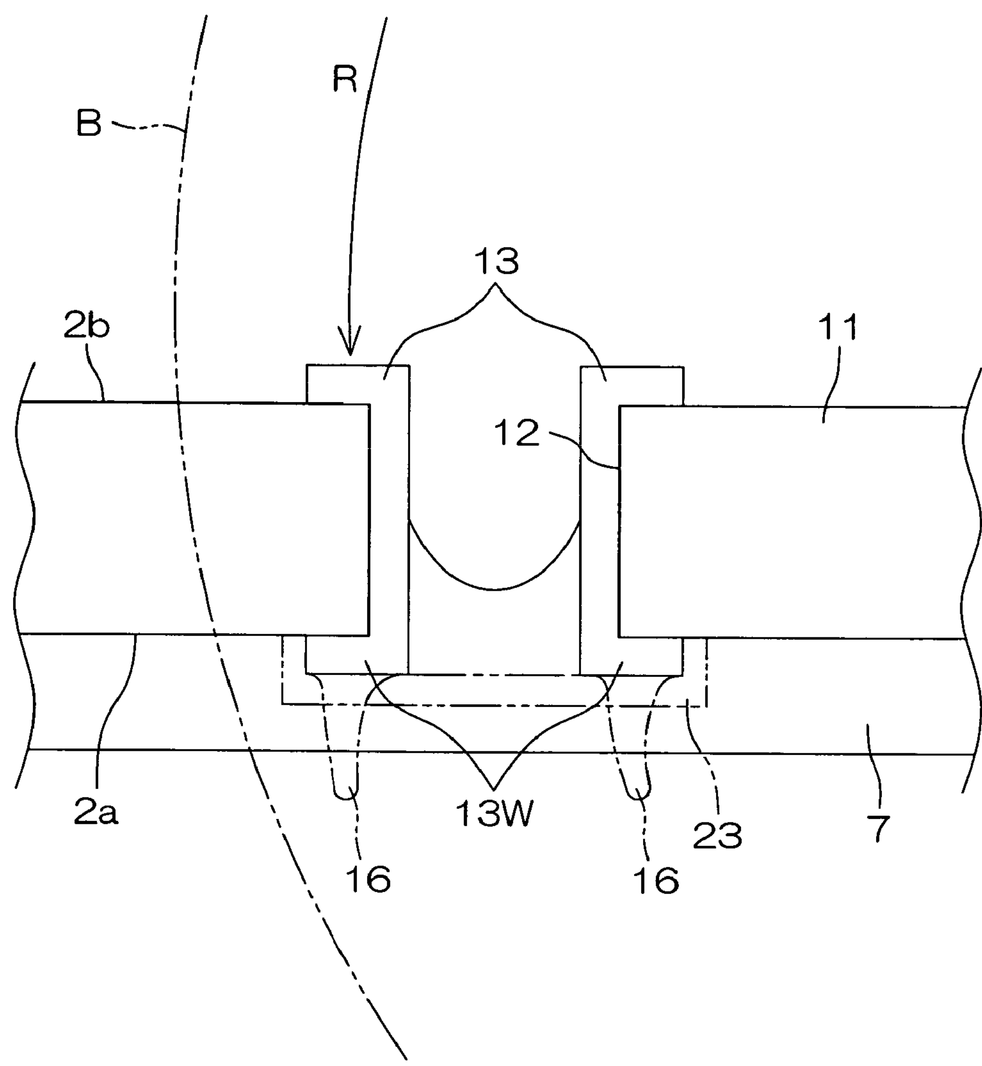
FIG. 4 is an illustrative side view showing a cut face of a base substrate.

FIG. 4 is an illustrative side view showing a cut face of the base substrate 11.

The base substrate 11 is mechanically cut by means of a cutting tool such as a dicing blade B (indicated by a two-dot-dash line in FIG. 4).

In the neighborhood of a part at which the base substrate 11 is cut, the dicing blade B is rotated so as to be relatively moved from the back surface 2*b* of the base substrate 11 toward the front surface 2*a* thereof (a rotational direction of the dicing blade B is indicated by an arrow R in FIG. 4). It is noted here that as seen from a portion 13W of the conductive film 13 which corresponds to the wiring portion 6W, the sealing resin layer 7 exists on a downstream side with respect to a moving direction of the dicing blade B. Likewise, as seen from a portion of the conductive film 13 which is formed on the back surface 2*b*, the base substrate 11 exists on the downstream side with respect to the moving direction of the dicing blade B.

Accordingly, the portion 13W of the conductive film 13 which corresponds to the wiring portion 6W and the portion of the conductive film 13 which is formed on the back surface 2*b* are prevented from sustaining burring as drawn by the dicing blade B. If the sealing resin layer 7 does not exist, the portion 13W of the conductive film 13 which corresponds to the wiring portion 6W is drawn and stretched by the dicing blade B, so as to produce burrs (elongated portions) 16 (indicated by two-dot-dash line in FIG. 4). However, the existence of the sealing resin layer 7 inhibits the conductive film 13 from being stretched in the direction of the relative movement of the dicing blade B. Therefore, no burrs 16 are produced.

According to the manufacture method, therefore, the semiconductor device 1 free of the burrs at the conductive member 6 can be manufactured. When mounted on the mounting board, the semiconductor device 1, which is free of the burrs at the conductive member 16, involves no fear of being short-circuited with any other component mounted on the mounting board.

According to the manufacture method, the sealing resin layer 7 overlaid on the portion 13W of the conductive film 13 corresponding to the wiring portion 6W can be formed by spreading the underfill material to the vicinity of the boundary between the adjoining wiring boards 2. Conventionally, the underfill material is provided only in the gap between the base substrate 11 (wiring board 2) and the semiconductor chip 3 and at its periphery.

Figure 5:
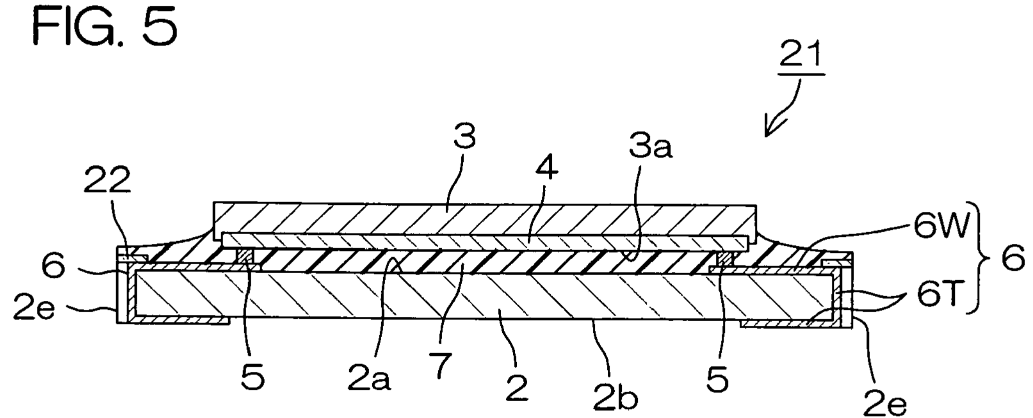
FIG. 5 is an illustrative sectional view showing a structure of a semiconductor device according to a second embodiment of the present invention.

FIG. 5 is an illustrative sectional view showing a structure of a semiconductor device according to a second embodiment of the present invention. In FIG. 5, those parts corresponding to the individual parts shown in FIG. 1 are represented by the same reference characters in FIG. 1, respectively.

The semiconductor device 21 comprises: the wiring board 2; and the semiconductor chip 3 connected thereto and directing its functional surface 3*a* to the wiring board. In the neighborhood of the end face 2*e* of the wiring board 2, the conductive film 6 formed of a metal material such as copper (Cu) is provided. The conductive film 6 includes: the external connection portion 6T continuously formed to cover an area extending from the end face 2*e* to the surface (back surface) 2*b* opposite from the front surface 2*a*; and the wiring portion 6W formed on the front surface 2*a* for interconnection between the external connection portion 6T and the connecting member 5.

Figure 6:
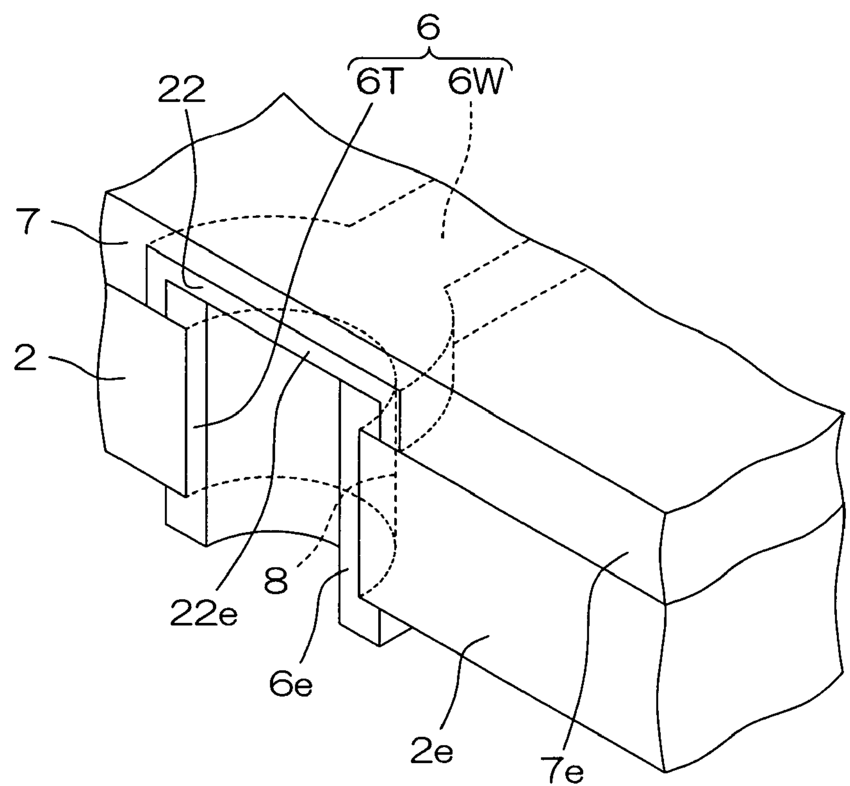
FIG. 6 is an illustrative perspective view showing in enlarged dimension a neighborhood of an end face of a wiring board of the semiconductor device shown in FIG. 5.

FIG. 6 is an illustrative perspective view showing in enlarged dimension the neighborhood of the end face 2*e* of the wiring board 2 of the semiconductor device 21.

The half-column like groove 8 is formed in the end face 2*e* as extending along the overall thickness of the wiring board 2. In the groove 8, the external connection portion 6T is formed along an inside surface of the groove 8.

A lid wiring 22 is formed in a manner to close the groove 8 at the front-surface-2*a* side thereof. In the plan view vertically viewing down the front surface 2*a*, the lid wiring 22 extends over the groove 8 and its circumferential area, thus defining a semi-circular shape. The lid wiring 22 is conductive and is formed of, for example, the same type of metal material as that of the conductive film 6.

The end face 7*e* of the sealing resin layer 7, the end face 6*e* of the external connection portion 6T and an end face 22*e* of the lid wiring 22 (face on the end-face-2*e* side with respect to the in-plane direction of the wiring board 2) are substantially flush with the end face 2*e* of the wiring board 2.

The semiconductor device 21 may be manufactured by the same method as that for the semiconductor device 1. In this process, the base substrate 11 is formed with a lid wiring 23 (indicated by a two-dot-dash line in FIG. 4) which overlies the wiring portion 6W and closes the through-hole 12 on the front-surface-2*a* side thereof.

When the layer of the uncured (liquid state) sealing resin 7P is overlaid on the front surface 2*a* of the base substrate 11, the lid wiring 23 can prevent the uncured sealing resin from flowing into the through-hole 12. This ensures that after curing of the uncured sealing resin, any portion of the sealing resin layer 7 does not exist in the through-hole 12.

When the base substrate 11 is cut along the boundary between the respective pair of adjoining wiring boards 2, the lid wiring 23 formed on the base substrate 11 defines the lid wiring 22 closing the groove 8 on the front-surface-2*a* side thereof.

The aforementioned method prevents the semiconductor device 21 from encountering a problem that the external connection portion 6T (partially or totally) is covered by the sealing resin layer 7, disabling connection by soldering.

While the embodiments of the present invention have been fully described, it is to be noted that the invention may be implemented in any other modes. The sealing resin layer 7, for instance, need not be formed on the overall area of the front surface 2*a* of the base substrate 11. In the region not opposed by the semiconductor chip 3, the sealing resin layer 7 need not be formed at any other place than that on the conductive film 13. In this case, as well, the burrs produced in conjunction with the cutting of the base substrate 11 can be obviated.

A detailed description has been made on the embodiments of the present invention, which are mere illustrative examples of the technical principles of the present invention, and the invention should not be construed to be limited to such illustrative examples. The spirit and scope of the present invention should be defined solely by the appended claims.

This application corresponds to Japanese Patent application No. 2004-341028 filed with Japanese Patent Office on Nov. 25, 2004, and the whole disclosure thereof is hereby incorporated by reference.

The invention claimed is:

1. A semiconductor device comprising:

a wiring board;

a semiconductor chip having a functional surface formed with a functional element and bonded to one surface of the wiring board as directing thereto the functional surface thereof and maintaining a predetermined distance with respect to the one surface of the wiring board;

a conductive member formed at least on the one surface of the wiring board and including an end face substantially flush with an end face of the wiring board; and a resin formed on the wiring board, a height of the resin being smaller than that of the semiconductor chip so that an opposite surface of the semiconductor chip from the functional surface is exposed from the resin, wherein the end face of the wiring board is a circumferential surface of the wiring board, wherein the resin having the height smaller than that of the semiconductor chip covers the conductive member on the wiring board and reaches to an adjacent region to the end face of the conductive member, and wherein the resin includes an end face substantially flush with the end face of the wiring board.

2. A semiconductor device according to claim 1, wherein the end face of the wiring board is formed with a groove extending along the overall thickness of the wiring board, and wherein the conductive member is continuously formed to extend from the one surface to the other surface opposite from the one surface via an inside surface of the groove.

3. A semiconductor device according to claim 2, further comprising a lid member formed to close the groove at a side thereof adjacent to the one surface.

4. A semiconductor device according to claim 3, wherein the lid member and the conductive member are both formed of a same type of metal material.

5. A semiconductor device according to claim 3, wherein the lid member consists of a plated layer.

6. A semiconductor device according to claim 3, wherein the lid member and the conductive member include copper.

7. A semiconductor device according to claim 2, wherein the groove has a half-column like shape.

8. A semiconductor device according to claim 1, wherein the semiconductor chip is connected to the conductive member on the wiring board in a flip chip manner.

9. A semiconductor device according to claim 1, further comprising a resin layer formed in a gap between the wiring board and the semiconductor chip.

10. A semiconductor device according to claim 9, wherein the resin layer is formed only on the conductive member in a region not opposed by the semiconductor chip.

11. A semiconductor device according to claim 1, wherein the semiconductor chip is connected to the conductive member by means of a connecting member.

12. A semiconductor device according to claim 1, wherein in a plan view vertically viewing down the one surface of the wiring board, the semiconductor chip is smaller than the wiring board.

13. A semiconductor device according to claim 1, wherein the semiconductor device comprises no solder ball as an external connection portion.

14. A semiconductor device according to claim 1, wherein the resin gradually rises from an edge of the wiring board to a side surface of the semiconductor chip so that the surface of the resin has a concave curved shape.

15. A semiconductor device comprising:

a wiring board;

a semiconductor chip having a functional surface formed with a functional element and bonded to the wiring board as directing thereto the functional surface thereof;

a conductive member including an end face substantially flush with an end face of the wiring board; and a resin formed on the wiring board, a height of the resin being smaller than that of the semiconductor chip so that an opposite surface of the semiconductor chip from the functional surface is exposed from the resin, wherein the end face of the wiring board is a circumferential surface of the wiring board, wherein the resin having the height smaller than that of the semiconductor chip covers the conductive member on the wiring board and reaches to an adjacent region to the end face of the conductive member, and wherein the resin includes an end face substantially flush with the end face of the wiring board.

16. A semiconductor device according to claim 15, wherein the end face of the wiring board is formed with a groove extending along the overall thickness of the wiring board, and wherein the conductive member is continuously formed to extend from a first surface of the wiring board to a second surface thereof opposite from the first surface via an inside surface of the groove.

17. A semiconductor device according to claim 16, wherein the lid member and the conductive member are both formed of a same type of metal material.

18. A semiconductor device according to claim 16, wherein the groove has a half-column like shape.

19. A semiconductor device according to claim 16, further comprising a lid member formed to close the groove at a side thereof adjacent to the first surface.

20. A semiconductor device according to claim 19, wherein the lid member consists of a plated layer.

21. A semiconductor device according to claim 19, wherein the lid member and the conductive member include copper.

22. A semiconductor device according to claim 15, wherein the semiconductor chip is connected to the conductive member on the wiring board in a flip chip manner.

23. A semiconductor device according to claim 15, further comprising a resin layer formed in a gap between the wiring board and the semiconductor chip.

24. A semiconductor device according to claim 23, wherein the resin layer is formed only on the conductive member in a region not opposed by the semiconductor chip.

25. A semiconductor device according to claim 15, wherein the semiconductor chip is connected to the conductive member by means of a connecting member.

26. A semiconductor device according to claim 15, wherein in a plan view vertically viewing down a first surface of the wiring board, the semiconductor chip is smaller than the wiring board.

27. A semiconductor device according to claim 15, wherein the semiconductor device comprises no solder ball as an external connection portion.

28. A semiconductor device according to claim 15, wherein the resin gradually rises from an edge of the wiring board to a side surface of the semiconductor chip so that the surface of the resin has a concave curved shape.

29. A semiconductor device comprising:

a wiring board;

a semiconductor chip having a functional surface formed with a functional element and bonded to the wiring board as directing thereto the functional surface thereof;

a conductive member including an end face substantially flush with an end face of the wiring board; and a resin formed on the wiring board so that an opposite surface of the semiconductor chip from the functional surface is entirely exposed from the resin, wherein the end face of the wiring board is a circumferential surface of the wiring board, wherein the resin covers the conductive member on the wiring board and reaches to an adjacent region to the end face of the conductive member, and wherein the resin includes an end face substantially flush with the end face of the wiring board.

30. A semiconductor device according to claim 29, wherein the end face of the wiring board is formed with a groove extending along the overall thickness of the wiring board, and wherein the conductive member is continuously formed to extend from a first surface of the wiring board to a second surface thereof opposite from the first surface via an inside surface of the groove.

31. A semiconductor device according to claim 30, further comprising a lid member formed to close the groove at a side thereof adjacent to the first surface.

32. A semiconductor device according to claim 31, wherein the lid member consists of a plated layer.

33. A semiconductor device according to claim 31, wherein the lid member and the conductive member include copper.

34. A semiconductor device according to claim 30, wherein the groove has a half-column like shape.

35. A semiconductor device according to claim 30, wherein the lid member and the conductive member are both formed of a same type of metal material.

36. A semiconductor device according to claim 29, wherein the semiconductor chip is connected to the conductive member on the wiring board in a flip chip manner.

37. A semiconductor device according to claim 29, further comprising a resin layer formed in a gap between the wiring board and the semiconductor chip.

38. A semiconductor device according to claim 37, wherein the resin layer is formed only on the conductive member in a region not opposed by the semiconductor chip.

39. A semiconductor device according to claim 29, wherein the semiconductor chip is connected to the conductive member by means of a connecting member.

40. A semiconductor device according to claim 29, wherein in a plan view vertically viewing down a first surface of the wiring board, the semiconductor chip is smaller than the wiring board.

41. A semiconductor device according to claim 29, wherein the semiconductor device comprises no solder ball as an external connection portion.

42. A semiconductor device according to claim 29, wherein the resin gradually rises from an edge of the wiring board to a side surface of the semiconductor chip so that the surface of the resin has a concave curved shape.

43. A semiconductor device comprising:

a wiring board;

a semiconductor chip having a functional surface formed with a functional element and bonded to the wiring board as directing thereto the functional surface thereof a conductive member including an end face substantially flush with an end face of the wiring board; and a resin formed on the wiring board so that an opposite surface of the semiconductor chip from the functional surface is entirely exposed from the resin, wherein the resin covers the conductive member on the wiring board and reaches to an adjacent region to the end face of the conductive member, and wherein the resin includes an end face substantially flush with the end face of the wiring board.

44. A semiconductor device according to claim 43, wherein the end face of the wiring board is formed with a groove extending along the overall thickness of the wiring board, and wherein the conductive member is continuously formed to extend from a first surface of the wiring board to a second surface thereof opposite from the first surface via an inside surface of the groove.

45. A semiconductor device according to claim 44, further comprising a lid member formed to close the groove at a side thereof adjacent to the first surface.

46. A semiconductor device according to claim 45, wherein the lid member consists of a plated layer.

47. A semiconductor device according to claim 45, wherein the lid member and the conductive member include copper.

48. A semiconductor device according to claim 44, wherein the lid member and the conductive member are both formed of a same type of metal material.

49. A semiconductor device according to claim 44, wherein the groove has a half-column like shape.

50. A semiconductor device according to claim 43, wherein the semiconductor chip is connected to the conductive member on the wiring board in a flip chip manner.

51. A semiconductor device according to claim 43, further comprising a resin layer formed in a gap between the wiring board and the semiconductor chip.

52. A semiconductor device according to claim 51, wherein the resin layer is formed only on the conductive member in a region not opposed by the semiconductor chip.

53. A semiconductor device according to claim 43, wherein the semiconductor chip is connected to the conductive member by means of a connecting member.

54. A semiconductor device according to claim 43, wherein in a plan view vertically viewing down a first surface of the wiring board, the semiconductor chip is smaller than the wiring board.

55. A semiconductor device according to claim 43, wherein the semiconductor device comprises no solder ball as an external connection portion.

56. A semiconductor device according to claim 43, wherein the resin gradually rises from an edge of the wiring board to a side surface of the semiconductor chip so that the surface of the resin has a concave curved shape.

57. A semiconductor device comprising:

a wiring board;

a semiconductor chip having a functional surface formed with a functional element and bonded to the wiring board as directing thereto the functional surface thereof a conductive member including an end face substantially flush with an end face of the wiring board; and a resin formed on the wiring board so as to cover the wiring board and the conductive member on the wiring board so that an opposite surface of the semiconductor chip from the functional surface is entirely exposed from the resin, and wherein the resin includes an end face substantially flush with the end face of the wiring board.

58. A semiconductor device according to claim 57, wherein the end face of the wiring board is formed with a groove extending along the overall thickness of the wiring board, and wherein the conductive member is continuously formed to extend from a first surface of the wiring board to a second surface thereof opposite from the first surface via an inside surface of the groove.

59. A semiconductor device according to claim 58, further comprising a lid member formed to close the groove at a side thereof adjacent to the first surface.

60. A semiconductor device according to claim 59, wherein the lid member consists of a plated layer.

61. A semiconductor device according to claim 59, wherein the lid member and the conductive member include copper.

62. A semiconductor device according to claim 58, wherein the lid member and the conductive member are both formed of a same type of metal material.

63. A semiconductor device according to claim 58, wherein the groove has a half-column like shape.

64. A semiconductor device according to claim 57, wherein the semiconductor chip is connected to the conductive member on the wiring board in a flip chip manner.

65. A semiconductor device according to claim 57, further comprising a resin layer formed in a gap between the wiring board and the semiconductor chip.

66. A semiconductor device according to claim 65, wherein the resin layer is formed only on the conductive member in a region not opposed by the semiconductor chip.

67. A semiconductor device according to claim 57, wherein the semiconductor chip is connected to the conductive member by means of a connecting member.

68. A semiconductor device according to claim 57, wherein in a plan view vertically viewing down a first surface of the wiring board, the semiconductor chip is smaller than the wiring board.

69. A semiconductor device according to claim 57, wherein the semiconductor device comprises no solder ball as an external connection portion.

70. A semiconductor device according to claim 57, wherein the resin gradually rises from an edge of the wiring board to a side surface of the semiconductor chip so that the surface of the resin has a concave curved shape.

* * * * *